(12) United States Patent
Lee

(10) Patent No.: US 7,064,577 B1
(45) Date of Patent: Jun. 20, 2006

(54) METHOD AND APPARATUS FOR SUPPORTING VARIABLE SPEED CONFIGURATION HARDWARE

(75) Inventor: Andy L. Lee, San Jose, CA (US)

(73) Assignee: Altera Corporation, San Jose, CA (US)

( * ) Notice: Subject to any disclaimer, the term of this patent is extended or adjusted under 35 U.S.C. 154(b) by 128 days.

(21) Appl. No.: 10/428,641

(22) Filed: May 2, 2003

(51) Int. Cl.
  *H03K 19/173* (2006.01)
(52) U.S. Cl. ............................. 326/38; 326/39; 326/41
(58) Field of Classification Search ............ 326/38–41; 716/16
See application file for complete search history.

(56) References Cited

U.S. PATENT DOCUMENTS

| | | | |
|---|---|---|---|
| 5,502,403 A * | 3/1996 | Liu et al. ...................... 326/46 |
| 5,732,407 A * | 3/1998 | Mason et al. ................ 711/104 |
| 5,737,235 A * | 4/1998 | Kean et al. .................... 716/16 |
| 5,963,048 A * | 10/1999 | Harrison et al. .............. 326/39 |
| 6,191,608 B1 * | 2/2001 | Cliff et al. .................... 326/38 |
| 6,230,307 B1 * | 5/2001 | Davis et al. .................. 716/16 |
| 6,507,942 B1 * | 1/2003 | Calderone et al. ............ 716/16 |
| 6,564,329 B1 * | 5/2003 | Cheung et al. ............. 713/322 |

\* cited by examiner

*Primary Examiner*—Vibol Tan
(74) *Attorney, Agent, or Firm*—L. Cho

(57) ABSTRACT

A programmable logic device (PLD) includes a plurality of programmable resources. The PLD includes configuration hardware that configures a first programmable resource at a first rate and a second programmable resource at a second rate with data that is provided to the configuration hardware at the first rate.

18 Claims, 6 Drawing Sheets

US 7,064,577 B1

METHOD AND APPARATUS FOR SUPPORTING VARIABLE SPEED CONFIGURATION HARDWARE

FIELD OF THE INVENTION

The present invention relates to programmable logic devices (PLDs). More specifically, the present invention relates to a method and apparatus for supporting variable speed configuration hardware in PLDs that may be used to program resources available on PLDs at different rates.

BACKGROUND

A desire to decrease the time required to configure a PLD has led to efforts in speeding up the configuration clock on the PLD that derives configuration. In most instances, the configuration clock is provided by a configuration device that transfers a programming object file to the PLD. Most configuration clocks provided by configuration devices are at a fixed clock frequency.

Some resources on the PLD, however, may have constraints that prevent them from being configured at higher frequencies. As a result, these slower resources dictated the maximum frequency of configuration. In instances where the resources requiring a slower rate of configuration represent a small subset of the configurable resources on a PLD, slowing the frequency for all the configuration of all the resources on the PLD is highly inefficient.

Approaches where configuration devices selectively changed configuration clocks in response to whether data being transmitted corresponded to the programming of slower or faster resources required significant complexity to be added to the clocking generation components in the configuration devices. Furthermore, approaches proposed to decrease the configuration time of the PLD by modifying the configuration hardware on the PLD to reduce the constraints on the slower resources proved to be costly.

Thus, what is need is a method and apparatus for supporting variable speed configuration hardware in PLD that may be used to program resources available on the PLD at different rates that is efficient and cost effective.

SUMMARY

A data synchronization unit is disclosed according to an embodiment of the present invention that allows configuration hardware in a PLD to run at varying speeds during configuration. The data synchronization unit allows a configuration device to provide a single, fixed clock frequency which makes the varying speed transparent to the user.

A method for formatting data for programming a PLD is disclosed according to an embodiment of the present invention. A first type of data to be used for programming a first resource on the PLD at a first rate is identified. A second type of data to be used for programming a second resource on the PLD at a second rate is identified. Additional copies of the second type of data is generated such that when the data is transmitted to the PLD at the first rate it appears to the PLD as if the second type of data is changing at the second rate.

A programmable logic device is disclosed according to an embodiment of the present invention. The PLD includes a plurality of programmable resources. The PLD also includes configuration hardware that configures a first programmable resource at a first rate and a second programmable resource at a second rate with data that is provided to the configuration hardware at the first rate.

A method for processing data for programming a PLD is disclosed according to an embodiment of the present invention. A type of data received is identified. A rate the data is latched is adjusted in response to the type of data. The PLD is programmed with the data at the rate.

BRIEF DESCRIPTION OF THE DRAWINGS

The features and advantages of the present invention are illustrated by way of example and are by no means intended to limit the scope of the present invention to the particular embodiments shown, and in which.

DETAILED DESCRIPTION

In the following description, for purposes of explanation, specific nomenclature is set forth to provide a thorough understanding of the present invention. However, it will be apparent to one skilled in the art that these specific details may not be required to practice the present invention. In other instances, well-known circuits and devices are shown in block diagram form to avoid obscuring the present invention unnecessarily. Additionally, the interconnection between circuit elements or blocks may be shown as buses or as single signal lines. Each of the buses may alternatively be single signal lines, and each of the single signal lines may alternatively be buses.

Figure 1:
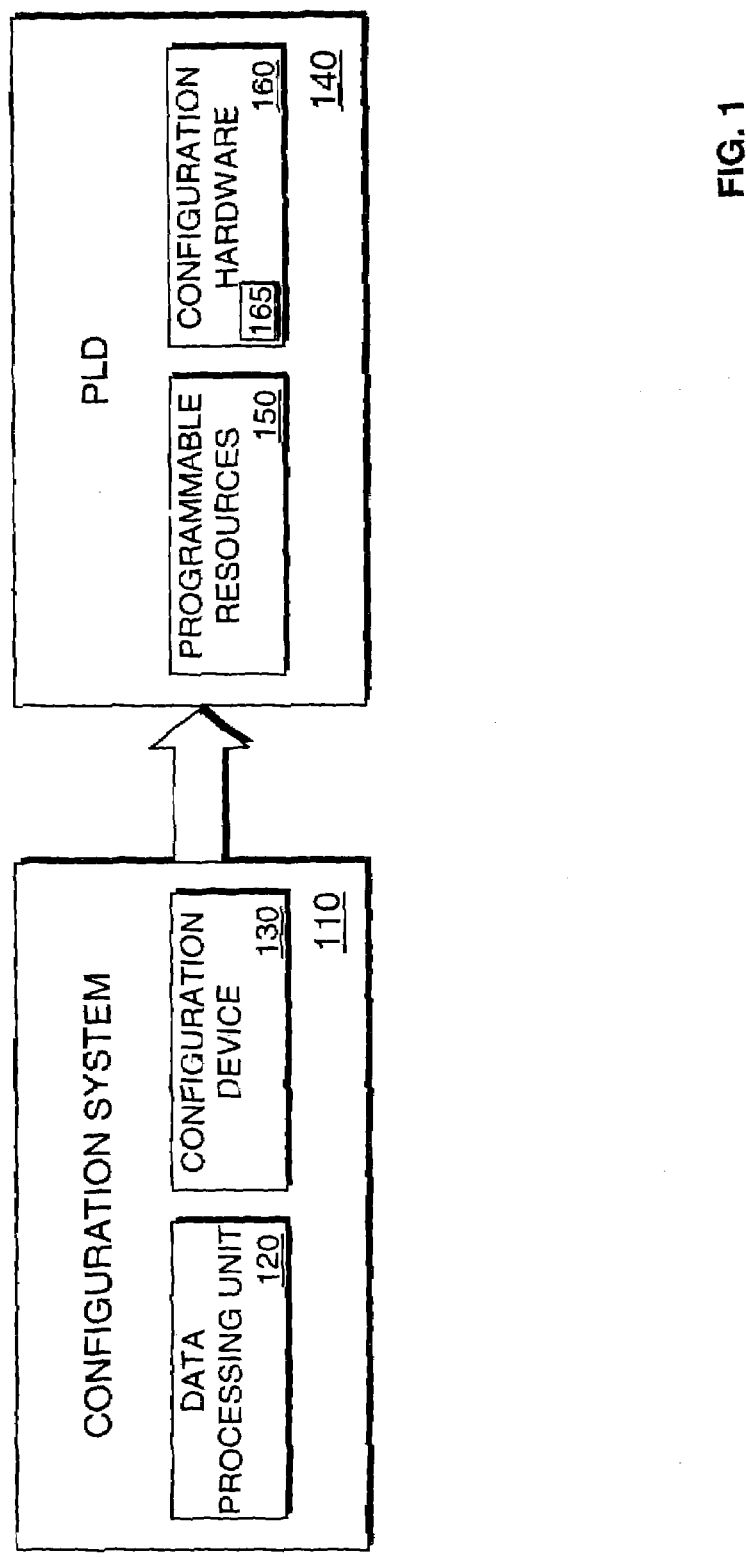
FIG. 1 is a block diagram of configuration system and a PLD according to an embodiment of the present invention.

FIG. 1 is a block diagram of a configuration system 110 and a PLD 140 according to an embodiment of the present invention. The configuration system 110 may be used to generate and transmit a programming object file that may be used to configure/program programmable resources 150 on the PLD 140. The configuration system 110 includes a data processing unit 120. The data processing unit 120 may interface with an electronic design automation (EDA) tool (not shown) or other devices to obtain relevant data which may be used to generate a programming object file that may be used to program the programmable resources 150 at variable rates.

The configuration system 110 includes a configuration device 130. The configuration device 130 stores the programming object file generated by the data processing unit 120. The configuration device 130 may also transmit the programming object file to the PLD 140 and provide a clock to drive the configuration of the PLD 140. According to an embodiment of the present invention, the configuration system 110 may provide compression and encryption functionalities that compress and encrypt the programming object file. The configuration device 130 may be implemented using components such as erasable programmable read-only memories (EPROM)s, a CPU host, and/or other components.

The PLD 140 includes programmable resources 150. The programmable resources 150 may include a first plurality of resources that may be configured at a first rate and a second plurality of resources that may be configured at a second rate. The first plurality of resources may include, for example, configurable random access memories (CRAMs) (not shown) that may be used to configure logic elements (LEs) the make up the core of the PLD 140. The second plurality of resources may include, for example, configurable shift registers (CSRs) (not shown) that may be used to configure I/O buffers in the PLD 140.

The PLD 140 includes configuration hardware 160. The configuration hardware 160 operates to configure the programmable resources 150 in response to the data in the programming object file generated by the configuration system 110. The configuration hardware 150 may include, for example, an external interface sub-block (not shown) that performs data conversion, a configuration sub-block (not shown) that controls programming registers (not shown) within the PLD 140, a core interface sub-block (not shown) that controls signals that are transmitted from the configuration sub-block, and an error detection block (not shown) that facilitates the detection of soft errors. According to an embodiment of the present invention, the configuration hardware 150 may operate at variable speeds during configuration to program the programmable resources 150. For example, the configuration hardware 150 may operate at a first configuration frequency to configure the first programmable resource at the first rate and operate at a second configuration frequency to configure the second programmable resource at the second rate.

The configuration hardware 160 includes a data synchronization unit 165. The data synchronization unit 165 receives programming object file data and a clock signal from the configuration system 110. According to an embodiment of the present invention, data associated with the programmable resources requiring a slower rate of configuration is repeated in the programming object file. The data synchronization unit 165 latches data from the programming object file and drives the data at a rate such that the configuration hardware 160 may program the programmable resource 150 at a rate appropriate to specific resources. By selectively latching the repeated data in the programming object file at a slower rate, the data associated with the programmable resource requiring a slower rate of configuration may be made to appear to be transmitted at the slower rate. It should be appreciated that in alternate embodiments of the present invention, some of the components on the configuration system 110 may be implemented on the PLD 140.

Figure 2:
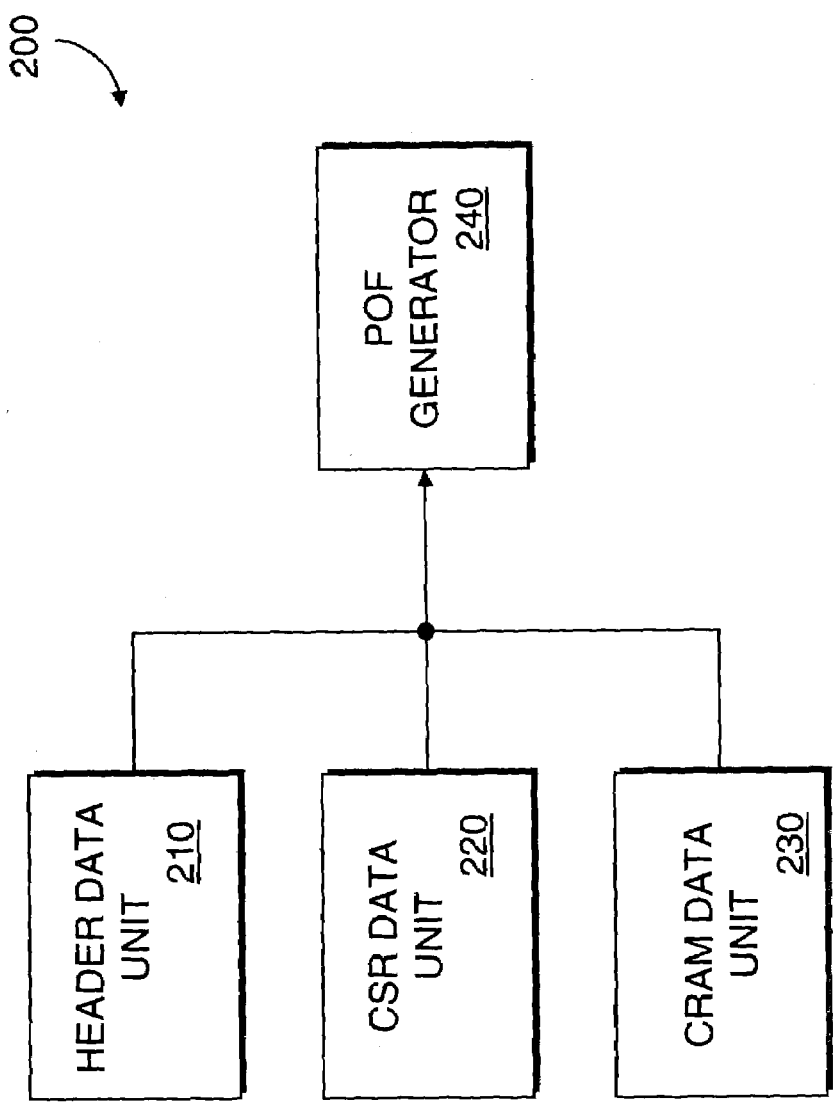
FIG. 2 is a block diagram of a data processing unit according to an embodiment of the present invention.

FIG. 2 is a block diagram of a data processing unit 200 according to an embodiment of the present invention. The data processing unit 200 may be used to implement the data processing unit 120 shown in FIG. 1. The data processing unit 200 generates a programming object file that may be used to program the programmable resources 150 (shown in FIG. 1) at variable rates. The data processing unit 200 includes a header data unit 210. The header data unit 210 interfaces with an EDA tool (not shown) to identify data to be provided in a header of the programming object file. Data that may be provided in a header of a programming object file may include, for example, user option settings for the PLD 140 (shown in FIG. 1), Joint Test Action Group (JTAG) IDs, CRC bits, and other information.

The data processing unit 200 includes a CSR data unit 220. The CSR data unit 220 interfaces with the EDA tool to identify CSR programming data to be provided in the programming object file. The CSR programming data may be used, for example, to configure I/O buffers to meet specific standards, current drives, and other requirements.

The data processing unit 200 includes a CRAM data unit 230. THE CRAM data unit 230 interfaces with the EDA tool to identify CRAM programming data to be provided in the programming object file. The CRAM programming data may be used, for example, to program CRAMs that support core components such as LEs and routing resources on the PLD 140.

The data processing unit 200 includes a program object file generator 240. The program object file generator 240 receives the header data, CSR data, and CRAM data from the header data unit 210, CSR data unit 220, and CRAM data unit 230. The program object file generator 240 formats the data received into a format recognized by the configuration hardware 140 (shown in FIG. 1). According to an embodiment of the present invention, the configuration data is divided into a predetermined number of bits, called a frame. The entire configuration bitstream includes an integer number of frames. In this embodiment, the frames including header data is ordered first in the programming object file, frames containing CSR data are ordered next, and frames containing CRAM data are ordered last.

The program object file generator 240 recognizes each type of data received and the rate in which the data may be driven to configure the programmable resources 150 on the PLD 140. According to an embodiment of the data processing unit 200, the programming object file generator 240 generates additional copies of data corresponding to a programmable resource that requires a slower rate for configuration and inserts the additional copies of data into frames in the programming object file. The number of additional copies inserted into the frames may correspond to the difference between the configuration rate of the slower programmable resource and the configuration rate of the fastest programmable resource. By generating a programming object file where data corresponding to programmable resources having a slower rate of configuration are repeated, the data may be made to appear to the PLD 140 as if it was changing or clocked in at a reduced frequency.

Consider an example where the configuration hardware 160 of the PLD 140 supports a configuration frequency of 100 MHz for configuring CRAMs, but a configuration frequency of only 25 MHz for configuring CSRs. The data corresponding to programming the CSRs may be copied such that for each data transmitted to the PLD 140 for programming CRAMs, four copies of data are transmitted to the PLD 140 for programming the CSRs. The configuration system 10 may clock out the programming configuration file at 100 MHz. When the configuration hardware 160 on the PLD 140 is configuring the CSRs, the clock driving the configuration may be reduced to ¼ of its speed to 25 MHz.

According to an embodiment of the present invention, the components illustrated in FIG. 2 may represent software modules where formatting a programming object file is performed by a computer system (not shown) executing sequences of instructions represented by the software modules. It should be appreciated that in alternate embodiments, hard-wire circuitry may be used in place of or in combination with software instructions to implement the data processing unit 200. Thus, the data processing unit 200 is not limited to any specific combination of hardware circuitry and software. FIG. 2 illustrates an example of the types of components that may be utilized for formatting a programming object file that configures exemplary programming resources. It should be appreciated, however, that other types of programming object files may be generated to configure other types of programmable resources at variable rates. For example, the data processing unit 120 may generate a programming object file that may be used to configure programming resources that may be configured at more than 2 different rates.

Figure 3:
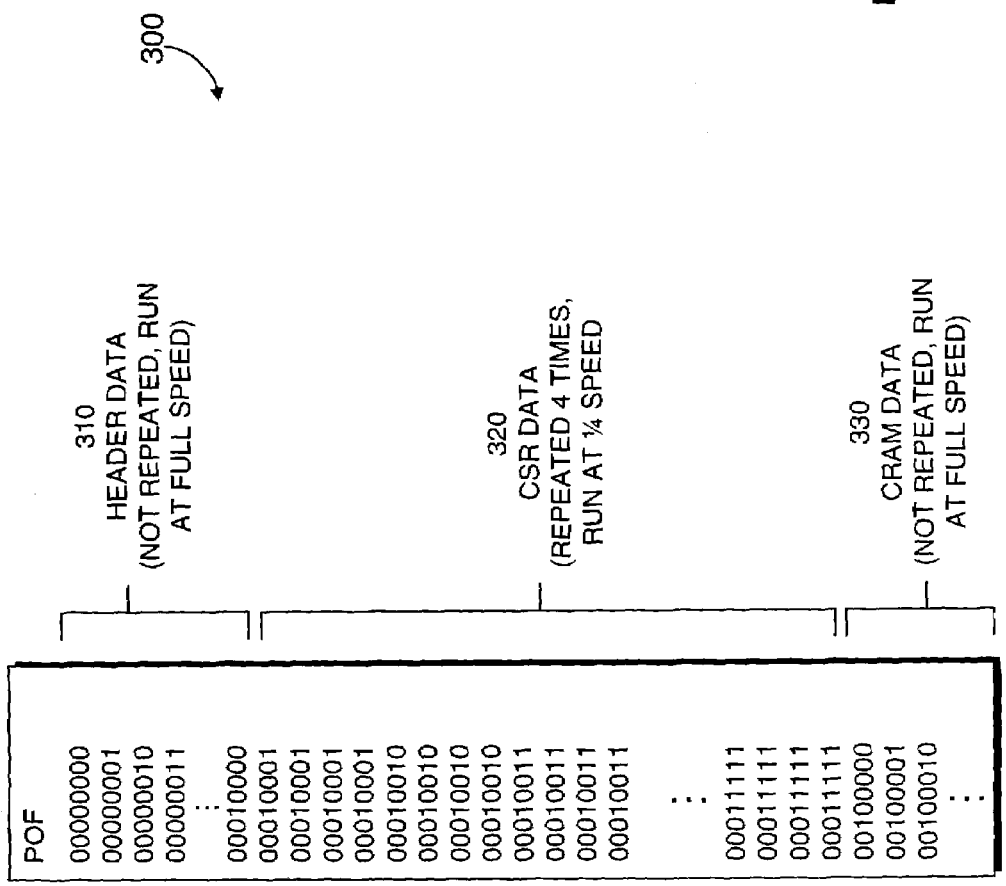
FIG. 3 illustrates a programming object file according to an embodiment of the present invention.

FIG. 3 illustrates a programming object file 300 according to an embodiment of the present invention. The programming object file 300 includes a first section 310, a second section 320, and a third section 330. The first section 310 may include a first plurality of frames (not shown) designated for storing header data. The second section 320 may include a second plurality of frames (not shown) designated for storing CSR data. The third section 330 may include a third plurality of frames (not shown) designated for storing CRAM data. As shown the header data may be formatted in the first section 310 such that it is not repeated and may run at full speed. The CSR data may be formatted in the second section 320 such that it is repeated 4 times and may, therefore, run at ¼th of full speed. The CRAM data may be formatted in the third section 330 such that is not repeated and may run at full speed.

Figure 4:
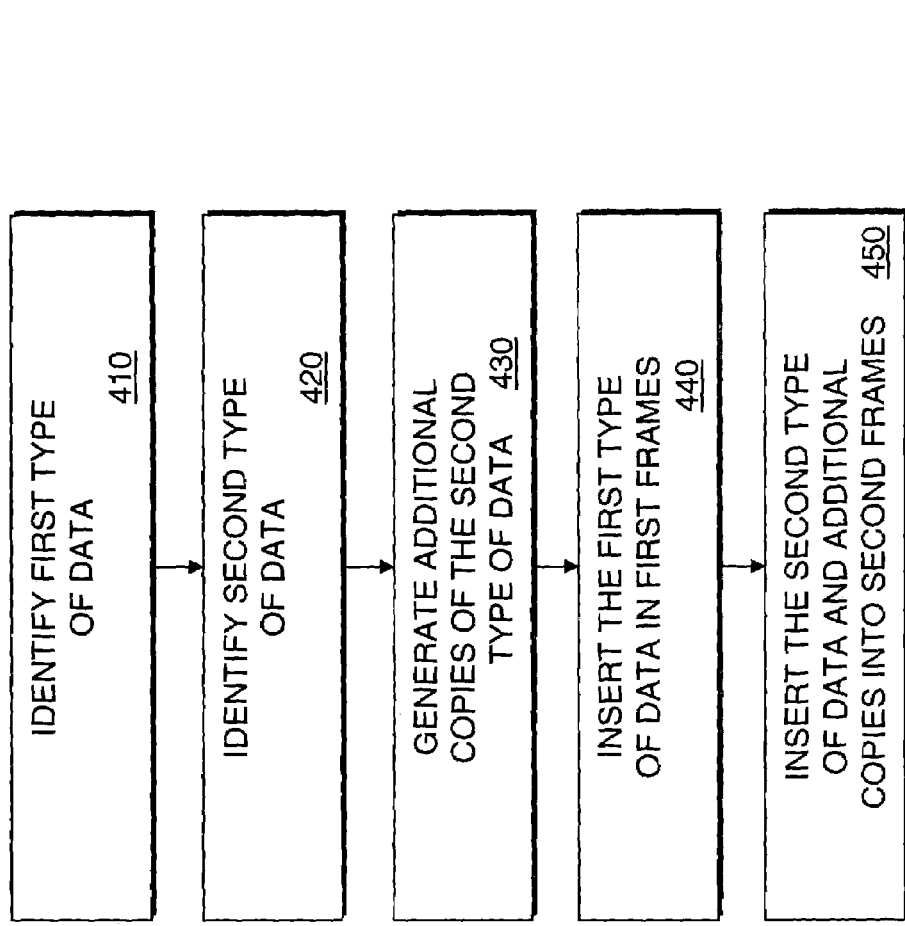
FIG. 4 is a flow chart illustrating a method for formatting a programming object file according to an embodiment of the present invention.

FIG. 4 is a flow chart illustrating a method for formatting a programming object file according to an embodiment of the present invention. At 410, a first type of data is identified. According to an embodiment of the present invention, the type of data identified may relate to the type of programmable resource it corresponds to and the rate in which the programmable resource may be configured. In one embodiment, the first type of data may pertain to a first type of programmable resource that may be configured at the maximum rate supported by configuration hardware on a PLD. This rate may be referred to as a maximum configuration frequency.

At 420, a second type of data is identified. According to an embodiment of the present invention, the type of data identified may relate to the type of programmable resource it corresponds to and the rate in which the programmable resource may be configured. In one embodiment, the second type of data may pertain to a second type of programmable resource that may be configured at a fraction of the maximum rate supported by the configuration hardware on the PLD.

At 430, additional copies of the second type of data is generated. The number of additional copies of data would approximately correlate with the difference between the rate in which the second type of programmable resource is configured and the maximum rate.

At 440, the first type of data is inserted into first frames of the programming object file.

At 450, the second type of data and the additional copies of the second type of data is inserted into second frames of the programming object file. According to an embodiment of the present invention, 430 and 450 may be achieved by repeating the second type of data. The total number of times the second type of data is inserted may be an inverse value of a ratio of its corresponding configuration rate and the maximum rate. It should be appreciated that the programming object file generated may be transmitted by the configuration device 120 (shown in FIG. 1) to the PLD 140 (shown in FIG. 1) at the maximum configuration frequency supported by the PLD 140. The programming object file generated is formatted such that frames of data may be latched by the PLD 140 such that it appears as if the second type of data is changing or is driven at a reduced frequency appropriate for its corresponding programmable resource.

Figure 5:
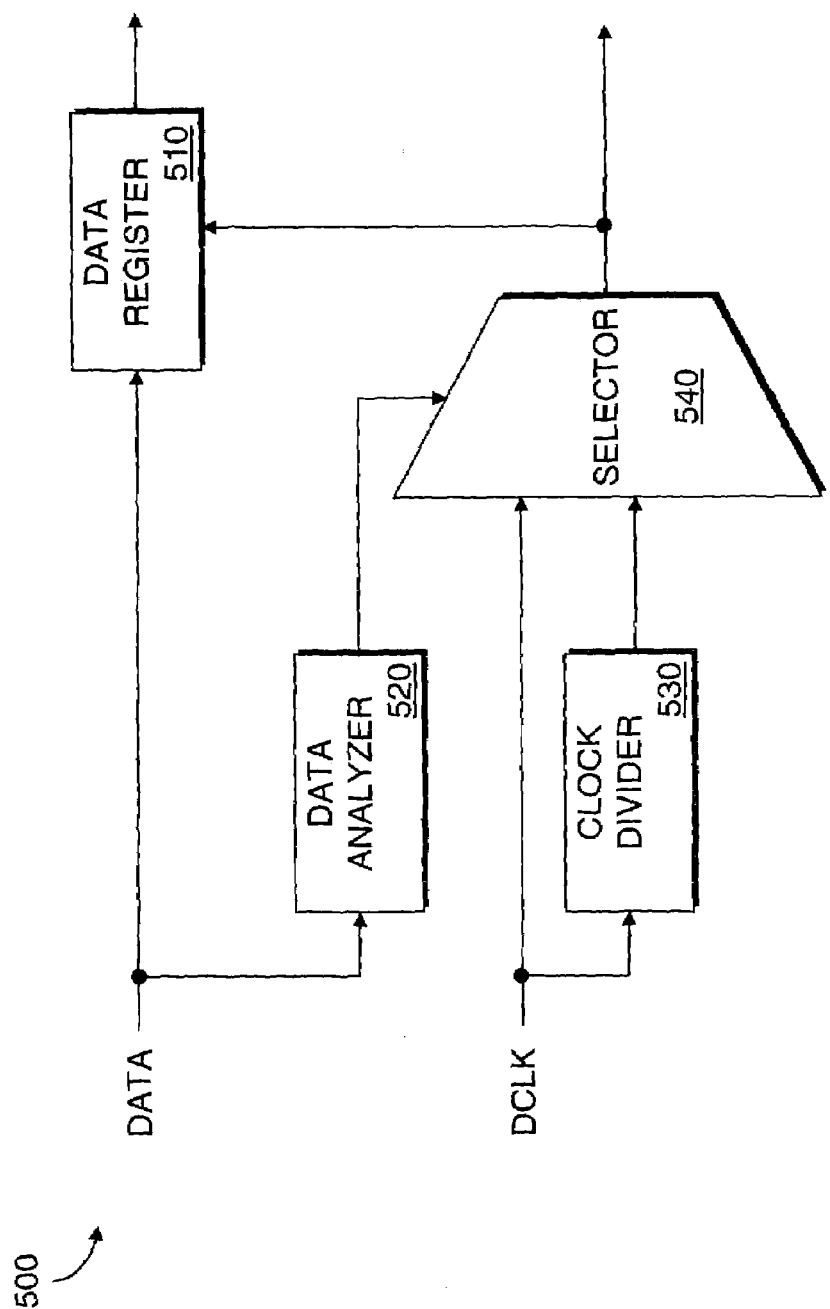
FIG. 5 is a block diagram of a data synchronization unit according to an embodiment of the present invention.

FIG. 5 is a block diagram of a data synchronization unit 500 according to an embodiment of the present invention. The data synchronization unit 500 may be used to implement the data synchronization unit 165 shown in FIG. 1. The data synchronization unit 500 operates to allow the configuration hardware 160 to configure programmable resources 150 at variable rates by receiving data from the programming object file that corresponds to the programmable resources 150 at an appropriate rate. The data synchronization unit 500 includes a data register 510. The data register 510 receives frames from the programming object file. The data register 510 latches the frames from the programming object file in response to a latching signal. According to an embodiment of the synchronization unit 500, the data register 510 may be implemented by a plurality of flip-flops.

The data synchronization unit 500 includes a data analyzer 520. The data analyzer 520 receives frames from the programming object file. The data analyzer 520 determines the rate in which the frames from the programming object file should be driven in the configuration hardware 160. According to an embodiment of the present invention, the data analyzer 520 makes this determination from recognizing the order in which frames are organized in a programming object file and keeping track of the frames received from the configuration system 110. The data analyzer 520 may be implemented by a state machine, counter, or other device.

The data synchronization unit 500 includes a clock divider 530. The clock divider 530 receives a clock from the configuration system 110 that is used to drive the programming object file. The clock divider 530 reduces the frequency of the clock. According to an embodiment of the present invention, the clock divider 530 reduces the frequency of the clock by a value that equals the ratio of the slowest configuration frequency of a programmable resource and the frequency of the clock.

The data synchronization unit 500 includes a selector 540. The selector 540 receives as inputs both the clock and the reduced frequency clock. The data analyzer 520 selects the input that corresponds to a frequency of configuration for a programmable resource utilizing a frame currently received. The selected input is transmitted from the selector 540 as a latching signal to the data register 510. The selected input is also transmitted as the clock signal to drive configuration of the corresponding programmable resource.

It should be appreciated that the data register 510, data analyzer 520, clock divider 530, and selector 540 may be implemented using any known circuitry or technique. According to an embodiment of the present invention, the data register 510, data analyzer 520, clock divider 530, and selector 540 may be implemented to reside on a single semiconductor substrate.

The present invention allows variable clock frequencies to be used during the configuration of the PLD 140. The change in clock frequency may be handled solely by repeated data in the programming object file and with the synchronization unit 165. Special clock circuitry is not required to be implemented by the configuration system 110 and knowledge of the clock frequency change is not required from the configuration device 130. The present invention allows the PLD 140 to utilize a clock frequency that matches its fastest configuration logic component (programmable resource), instead of using a clock frequency to match its slowest configuration logic component. This reduces the configuration times in PLD 140.

Figure 6:
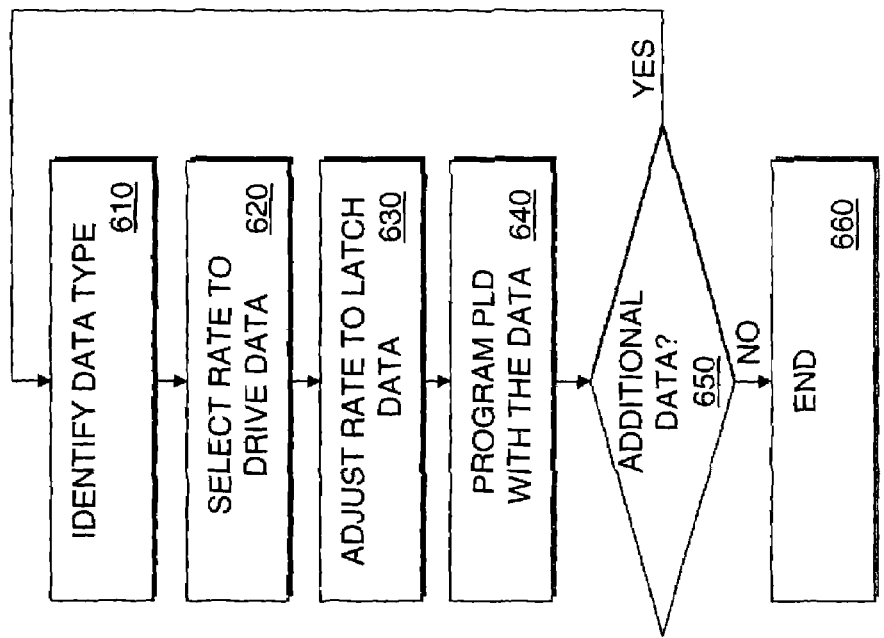
FIG. 6 is a flow chart illustrating a method for processing data for programming a PLD according to an embodiment of the present invention.

FIG. 6 is a flow chart illustrating a method for processing data for programming a PLD according to an embodiment of the present invention. At 610, a type of data received is identified. According to an embodiment of the present invention, the data is in a fixed format that is recognizable. For example, the data may arrive as frames in a programming object file where the order, number, and size of the frames are known. In this embodiment, the order in which a frame arrives may be used to determine a type of data in the frame. Identifying a type of data received may include determining whether the data received is header data, CSR data, or CRAM data.

At 620, a rate in which the data is driven is selected in response to the type of the data. According to an embodiment of the present invention, a plurality of clock frequencies are available to be selected to drive the data.

At 630, a rate in which the data is latched is adjusted in response to the type of the data. According to an embodiment of the present invention, the clock frequency selected to drive the data is used to latch the data from the programming object file. In an embodiment where data is transmitted into a data register, the data register may be toggled with the clock frequency selected.

At 640, a PLD is programmed with the data at the rate of the clock frequency selected.

At 650, it is determined whether additional data is received. If additional data is received, control proceeds to 610. If additional data is not received, control terminates the procedure as illustrated in 660. It should be appreciated that the identification of the type of the additional data may be made and the rate in which the additional data is to be latched may be adjusted in response to the type. The PLD may be programmed with the additional data at the rate in which the additional data is latched.

FIGS. 4 and 6 are flow charts illustrating a method for formatting a programming object file and a method for processing data for programming a PLD. Some of the techniques illustrated in these figures may be performed sequentially, in parallel or in an order other than that which is described. It should be appreciated that not all of the techniques described are required to be performed, that additional techniques may be added, and that some of the illustrated techniques may be substituted with other techniques.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A method for formatting data for programming a programmable logic device (PLD), comprising:
   identifying a first type of data to be used for programming a first resource on the PLD at a first rate;
   identifying a second type of data to be used for programming a second resource on the PLD at a second rate; and
   generating additional copies of the second type of data such that when the data is transmitted to the PLD at the first rate it appears to the PLD as if the second type of data is changing at the second rate.

2. The method of claim 1, wherein identifying the first type of data to be used for programming the first resource on the PLD at the first rate comprises identifying header data.

3. The method of claim 1, wherein identifying the first type of data to be used for programming the first resource on the PLD at the first rate comprises identifying configuration random access memory (CRAM) data.

4. The method of claim 1, wherein identifying the second type of data to be used for programming the second resource on the PLD at the first rate comprises identifying configuration shift register (CSR) data.

5. The method of claim 1, further comprising:
   inserting the first type of data into first frames in a programming object file;
   inserting the second type of data and additional copies of the second type of data into frames in the programming object file.

6. A programmable logic device (PLD), comprising: a plurality of programmable resources; and configuration hardware that configures a first programmable resource at a first rate and a second programmable resource at a second rate with data that is provided to the configuration hardware, wherein the first rate is faster than the second rate.

7. The PLD of claim 6, wherein the first programmable resource comprises configuration random access memory (CRAM).

8. The PLD of claim 6, wherein the second programmable resource comprises a configuration shift register (CSR).

9. The PLD of claim 6, wherein the configuration hardware comprises a data synchronization unit that includes:
   a data analyzer that identifies a type of data received;
   a clocking unit that adjusts a rate of a clock in the configuration hardware in response to the type of data received; and
   a data register that latches the data received at the rate of the clock.

10. The PLD of claim 9, wherein the data analyzer is a state machine.

11. The PLD of claim 9, wherein the clocking unit comprises:
    a clock divider; and
    a selector.

12. The PLD of claim 9, wherein the data register comprises a flip-flop.

13. A method for processing data for programming a programmable logic device (PLD), comprising:
    identifying a type of data received by determining whether the data received is header data, configuration shift register (CSR) data, or configuration random access memory (CRAM) data;
    adjusting a rate the data is latched in response to the type of data; and
    programming the PLD with the data at the rate.

14. A method for processing data for programming a programmable logic device (PLD), comprising:
    identifying a type of data received;
    adjusting a rate the data is latched in response to the type of data by selecting one of a first and second clock frequency in response to the type of data received, and toggling a data input register with the clock frequency selected; and
    programming the PLD with the data at the rate.

15. The method of claim 14, wherein programming the PLD with the data at the rate comprises driving the data at the clock frequency selected.

16. A method for processing data for programming a programmable logic device (PLD), comprising:
    identifying a type of data received;
    adjusting a rate the data is latched in response to the type of data;

programming the PLD with the data at the rate;
identifying a type of a second data received;
adjusting a rate in which the second data is latched in response to the type of the second data; and
programming the PLD with the second data at the rate in which the second data is latched.

17. A method for programming a programmable logic device (PLD), comprising:
identifying a first type of data to be used for programming a first resource on the PLD at a first rate;
identifying a second type of data to be used for programming a second resource on the PLD at a second rate;
generating additional copies of the second type of data;
transmitting data including the first type of data, the second type of data and the additional copies of the second type of data to the PLD at the first rate;
identifying a type of data received at the PLD;
adjusting a rate the data is latched in response to the type of data; and
programming a resource on the PLD with the data at the rate.

18. The method of claim 1, wherein generating additional copies of the second type of data comprises generating 3 additional copies of the second type of data.

* * * * *